(12) United States Patent
Mallinson (10) Patent No.: US 8,350,734 B1
(45) Date of Patent: Jan. 8, 2013

(54) METHOD AND APPARATUS FOR DIGITAL TO ANALOG CONVERSION OF DATA STREAM WITH RANDOM AND LOW-FREQUENCY PERIODIC JITTER

(75) Inventor: Andrew Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 1012 days.

(21) Appl. No.: 12/350,884

(22) Filed: Jan. 8, 2009

Related U.S. Application Data (60) Provisional application No. 61/121,516, filed on Dec. 10, 2008.

(51) Int. Cl.
*H03M 7/00* (2006.01)

(52) U.S. Cl. ............... 341/59; 341/58; 341/65; 341/67; 341/70; 341/71

(58) Field of Classification Search ................ 341/58, 341/59, 65, 67, 70, 71, 106, 107
See application file for complete search history.

(56) References Cited

U.S. PATENT DOCUMENTS

| | | | |
|---|---|---|---|
| 5,889,820 A | 3/1999 | Adams | |
| 5,910,924 A * | 6/1999 | Tanaka et al. | 365/226 |
| 6,208,671 B1 | 3/2001 | Paulos et al. | |
| 6,477,125 B1 * | 11/2002 | Hayami | 369/59.22 |
| 6,573,759 B2 | 6/2003 | Shuholm | |
| 6,614,369 B1 | 9/2003 | Widmer | |
| 6,768,433 B1 | 7/2004 | Toth et al. | |
| 6,782,300 B2 | 8/2004 | Pillay et al. | |
| 6,901,127 B1 | 5/2005 | Margules | |
| 6,914,545 B1 | 7/2005 | Zaidi | |
| 6,937,551 B2 * | 8/2005 | Miyashita et al. | 369/53.16 |
| 6,961,010 B2 | 11/2005 | Tsang | |
| 7,178,093 B2 * | 2/2007 | Chen et al. | 714/796 |
| 7,356,097 B2 * | 4/2008 | Park et al. | 375/341 |
| 7,434,149 B2 * | 10/2008 | Shih et al. | 714/795 |
| 7,535,384 B2 * | 5/2009 | Kondo et al. | 341/59 |
| 7,590,929 B2 * | 9/2009 | Morita et al. | 714/800 |
| 7,612,697 B1 * | 11/2009 | Chaichanavong et al. | 341/59 |
| 7,626,520 B2 * | 12/2009 | Noda | 341/58 |
| 2006/0083337 A1 * | 4/2006 | Higashino | 375/341 |
| 2011/0083054 A1 * | 4/2011 | Ozdemir et al. | 714/752 |

OTHER PUBLICATIONS

Albert X. Widmer, Peter A. Franaszek, A DC-Balanced, Partitioned-Block, 8B/10B Transmission Code IBM Journal of Research and Development, 1983, vol. 27, Iss 5, pp. 440-451.

Frandsen, C., and M. Lave. "Plug and Play? an Investigation into Problems and Solutions of Digital Audio Networks." AES 116th Convention. Berlin, May 8-11, 2004. Accessed at <http://www.tcelectronic.com/TechLibrary.aspcfm> on Jan. 4, 2009.

(Continued)

*Primary Examiner* — Linh Nguyen (74) *Attorney, Agent, or Firm* — Kenta Suzue; Haynes Beffel & Wolfeld LLP (57) ABSTRACT

This application relates to decoding signals that carry clock and data information. In particular, it relates to construction a time-varying histogram of inter-arrival times between pulse edges and using the histogram to identify whether a pulse edge encodes a single length interval, a double length interval or some longer length interval. Further details and embodiments of the technology disclosed are provided in the drawings, detailed description and claims.

16 Claims, 4 Drawing Sheets

OTHER PUBLICATIONS

"SN 5497, SN 7497, synchronous six-bit binary rate multipliers" (revised Mar. 1988) accessed at http://focus.ti.com/lit/ds/symlink/sn7497.pdf on Jan. 6, 2009.

"SPIDF" accessed at http://www.epanorama.net/documents/audio/spicdf.html on Jan. 4, 2009.

John Freberg "Inside the AEA3-203 digital audio standard", accessed at: http://www.broadcastengineering.com/mag/broadcasting_inside_aea_digital/index.html on Jan. 4, 2009.

"Biphase mark code", accessed at http://en.wikipedia.org/wiki/Biphase_mark_code on Jan. 5, 2009.

"Manchester code", accessed at http://en.wikipedia.org/wiki/Manchester_code on Jan. 5, 2009.

"Line code", accessed at http://en.wikipedia.org/wiki/Line_code on Jan. 5, 2009.

"S/PDIF", accessed at http://en.wikipedia.org/wiki/S/PDIF on Jan. 5, 2009.

"Differential Manchester encoding" accessed at http://en.wikipedia.org/wiki/Differential_Manchester_encoding on Jan. 6, 2009.

P. Lesso, "A high performance S/SPDIF receiver", Audio Engineering Society Convention, Oct. 5-8, 2006.

* cited by examiner

METHOD AND APPARATUS FOR DIGITAL TO ANALOG CONVERSION OF DATA STREAM WITH RANDOM AND LOW-FREQUENCY PERIODIC JITTER

RELATED CASE

This application is related to and claims the benefit of U.S. Provisional Application No. 61/121,516, titled "A Method and Apparatus for Digital to Analog Conversion of Data Stream with Random and Low-Frequency Periodic Jitter", which was filed 10 Dec. 2008, and which is hereby incorporated by reference.

COPYRIGHT NOTICE

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright whatsoever.

REFERENCE TO COMPUTER PROGRAM LISTING APPENDIX

A computer program listing appendix has been electronically submitted with this application and is incorporated by reference. The computer program listing appendix includes the file "00147447.TXT", prepared on a Windows XP system, which uploaded as having a file size of 19,830 bytes on disk and was created on Jan. 7, 2009 at 11:50 AM.

BACKGROUND OF THE INVENTION

This application relates to decoding signals that carry clock and data information. In particular, it relates to construction of a time-varying histogram of inter-arrival times between pulse edges and using the histogram to identify whether a pulse edge encodes a single length interval, a double length interval or some longer length interval.

Biphase encoding is a family of digital codes used for transmission of audio signals and for communication. Biphase encoding is favored in noisy environments, where pulse edges are more easily and reliably detected than the peaks and troughs of pulses. Codes that rely on biphase encoding include the biphase mark code (BMC), the Manchester code and the differential Manchester code. Common to these codes, at least one transition (or pulse edge) occurs for each data bit and, sometimes, two transitions. The presence of transitions in the bits, even if a string of ones are zeros is repeated, allows biphase encoding to reliably carry both clock information and data. Further discussions of these codes can be found in Wikipedia, in the general category of "line codes" and specifically articles for "biphase mark code", "Manchester code" and "differential Manchester code."

Biphase encoding facilitates so-called clock recovery and synchronization. The signal encoded typically is time sensitive, such as samples from an audio stream. Reconstruction of the original signal from the encoded signal is time dependent. The encoded signal is delivered asynchronously, so the source and the decoder are operating with different clocks. The source clock can be recovered from the encoding, because every bit (with exceptions related to framing) includes a transition that can be used to recover a clock edge. The decoder synchronizes its clock with the source clock using logic such as an analog phase lock loop or a digitally controlled oscillator.

Biphase codes belong to a more general family of balanced or grey codes with limited run lengths. These codes are balanced in the sense of being DC balanced; the DC offset from cumulative codes is either zero or a specific proportion of the bits in the code stream. In this application, when we refer to a code as having a limited run length or as being run length limited, we mean a code that ensures that within n bits there will be a transition between a "0" and "1" bit, either 0/1 or 1/0. Generally, n is less than or equal to 20. Commonly, n is less than or equal to 10. Encodings that result in shorter maximum lengths of running zeros or ones, run lengths limited to 9, 8, 7, 6, 5 and 4 bits, are described in the patents that have been incorporated by reference.

Figure 1:
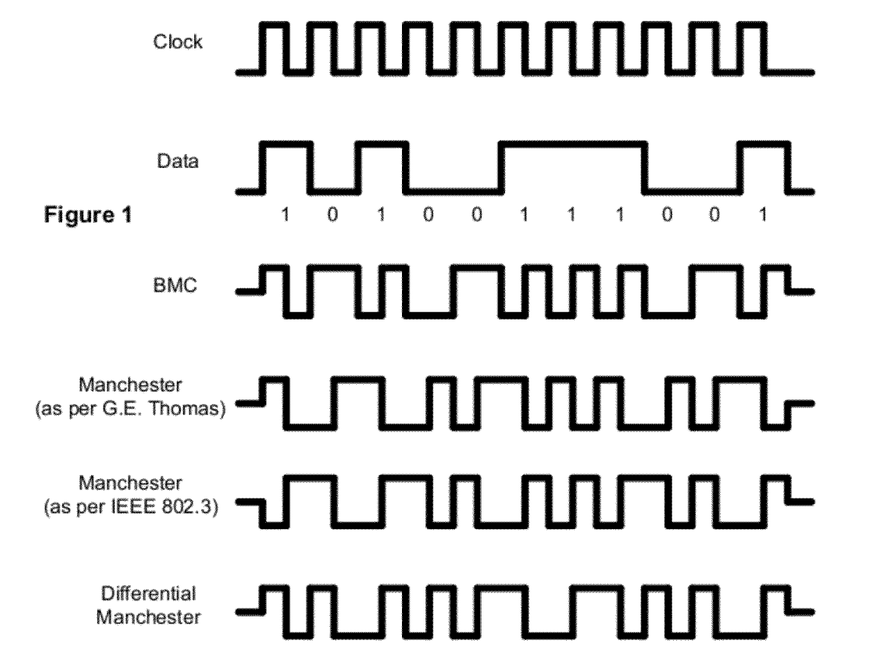
FIG. 1 illustrates biphase encoding.

Illustrations of biphase encoding are given in FIG. 1. A clock is represented at the top of the figure, followed by data in both waveform and numeric representations. Four encoding examples follow, representing a biphase mark code, variations on the Manchester code that represent a "zero" as either a rising or falling edge, and a differential Manchester code. In the biphase mark code, every bit of the original data is represented as two logical states which, together, form a bit. A "one" in the input is represented by two unequal states (10 or 01). A "zero" in the input is represented by two equal states (00 or 11). A transition or edge defines the beginning and end of a data bit. The particulars of encoding data using other biphase encoding rules are easily found in Wikipedia and elsewhere. A common application of biphase encoding is audio transfer. The Sony-Philips Digital Interconnect Format (SPDIF or S/PDIF), typically used for home applications, combines the biphase mark code with a particular preamble that violates the biphase encoding rules once per frame, in the preamble. SPIDF framing is specified in the worldwide standard IEC958 1989-03 (consumer part) from the EBU, which has a Japanese counterpart EIAJ CP-340 1987-9. See "SPIDF" accessed at http://www.epanorama.net/documents/audio/spidf.html on Jan. 4, 2009. In this application, we refer collectively to these standards for a digital audio interface, their predecessors and successors as the "SPIDF standard." The SPIDF standard for consumers is compatible with the AES/EBU standard for professional audio work. The consumer and professional standards differ primarily in sub code information and physical connectors. Both standards support 24-bit sample resolution.

According to these standards, samples are transmitted as 32-bit words or sub frames. These bits are used as follows:

| bits | meaning |
| --- | --- |
| 0-3 | Preamble |
| 4-7 | Auxillary-audio-databits |
| 8-27 | Sample |
| 28 | Validity |
| 29 | Sub code-data |
| 30 | Channel-status-information |
| 31 | Parity (bit 0-3 are not included) |

A 24- or 16-bit sample can be used. The 24-bit sample value uses bits 4-27. A CD-player uses only 16 bits, so only bits 13-27 are used, and bits 4-12 are set to 0.

One set of problems with decoding arises from jitter and drift. By jitter we mean instantaneous deviations from the intended clock frequency. Jitter has historically been a problem with point-to-point digital audio interfaces, as explained in the paper, Frandsen, C., and M. Lave. "Plug and Play? an Investigation into Problems and Solutions of Digital Audio Networks." AES116th Convention. Berlin, May 8-11, 2004. Accessed at <http://www.tcelectronic.com/TechLibrary.aspcfm> on Jan. 4, 2009. Among the products tested in that review, a receiver with jitter rejection of +/−10 ppm from −20 C to 70 C and +/−5 ppm per year would lock to only about half of the tested products, due to jitter. Id., at p. 7 & p. 12 table 9. Drift is less well defined. By drift, we mean relatively slow changes in the source clock frequency, such as 50-60 or 100-120 hertz changes, which can vary the position of data bits by more than a whole data bit interval, far outside the published jitter tolerance required of grade one or two devices.

An example of the phase lock loop (PLL) approach to jitter rejection and synchronization can be seen in U.S. Pat. No. 6,901,127, issued to Margules. The PLL is reference 18 in Margules' FIG. 1. FIGS. 4-5 further depict adjusting the PLL and maintaining lock.

An alternative approach can be seen in U.S. Pat. No. 5,889,820, issued to Adams. The technology described by Adams uses a digitally controlled oscillator in order to lock onto the timing of the biphase mark encoded input data. Another digitally controlled clock is described in U.S. Pat. No. 6,768,433 issued to Toth. All three of the Margules, Adam and Toth patents strive to synchronize and phase lock the source and decoder clocks, in support of decoding a biphase mark code input stream.

It should be apparent that there is an opportunity to introduce technology that has favorable jitter rejection characteristics, particularly technology that can handle both jitter and drift.

SUMMARY OF THE INVENTION

This application relates to decoding signals that carry clock and data information. In particular, it relates to construction a time-varying histogram of inter-arrival times between pulse edges and using the histogram to identify whether a pulse edge encodes a single length interval, a double length interval or some longer length interval. Further details and embodiments of the technology disclosed are provided in the drawings, detailed description and claims that follow.

DETAILED DESCRIPTION

The technology disclosed uses what we call a time-varying histogram to track the inter-arrival time of pulse edges, following any drift between the source decoder clocks, as well as rejecting jitter.

The embodiment most fully exemplified in this disclosure uses a biphase mark code for audio samples. We understand that biphase encoding is a special case of balanced codes or grey codes. The technology disclosed can readily be applied to any of the balanced or grey codes with a limited run length. See, e.g., U.S. Pat. No. 6,614,369 issued to Widmer (describing 7B/8B, 9B/10B and other encodings); U.S. Pat. No. 6,914,545 issued to Zaidi (describing 3B/4B and 8B/10B encodings); U.S. Pat. No. 6,961,010 issued to Tsang (providing sample tables of codes). These three patents are incorporated by reference to illustrate alternative codes to which the time-varying histogram technology can be applied. The number of bins in the time-varying histogram only need be adjusted to match the maximum run length of a limited run length code. Expanding the application of time-varying histogram technology to balanced codes with limited run lengths multiplies the environments in which the technology is useful. For instance, 8B/10B encoding is used for Fibre channel and rotating disk storage.

Figure 2:
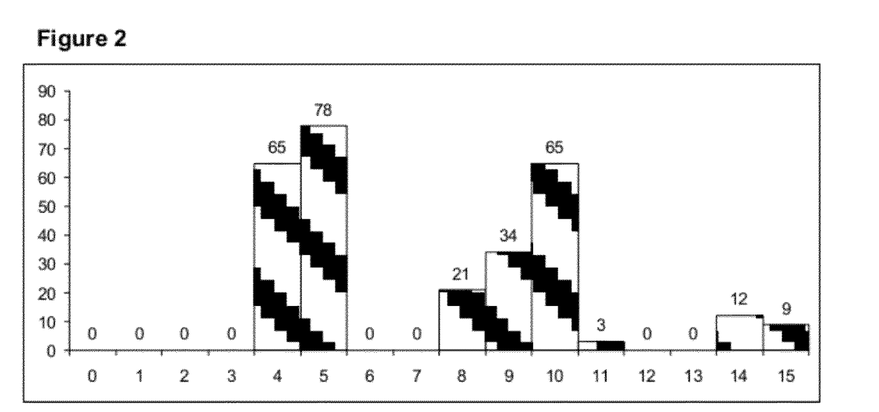
FIG. 2 depicts a histogram of data generated by sampling inter-arrival times of SPIDF pulse edges.

FIG. 2 depicts a histogram of data generated by sampling inter-arrival times of SPIDF pulse edges. The x-axis of the figure is a bin member, corresponding to a clock pulse. Data was collected for 20 bins, but is shown for only the first 16 bins, so some pulse edges may actually have fallen in bins 16-19. The clock used to collect a sample data was nominally running at 27 MHz. The leftmost histogram bin is bin 0, which corresponds to reset of counting. In this sample, bins 1-3, 6-7 and 12-14 have an edge frequency of zero after processing at least 287 pulse edges. The histogram reveals that a single length interval between pulse edges measures four to five clock cycles in length. A double length interval between pulse edges measures eight to ten clock cycles. A triple length interval, which corresponds to a preamble and violates normal biphase coding rules, measures at least 14 clock cycles. From collection of histogram data such as this, the circuit reliably distinguishes among single, double and triple length intervals between pulse edges.

A time-varying histogram records a frequency distribution of recent pulse edges, just as a moving average follows recent stock prices. One will immediately recognize a variety of ways to calculate a moving average of a stock price. To calculate a 32-day moving average, one can maintain a list of the last 32 days of closing prices. The price on the 33rd day can be used to replace the price on the first day and the average recalculated. Alternatively, one can maintain the sum of prices after 32 days, reduce the sum by ½nd and add back in the price on the 33rd day, then calculate the average. Or, one could apply the binary weighted frequency array approach described below to periodically reduce the average. Any of these approaches can be used to maintain individual bins in the time-varying histogram.

Three additional approaches could be used to maintain values in time-varying histogram registers. First, a binary rate multiplier (BRM) could be used, such as described in "SN 5497, SN 7497, Synchronous Six-Bit Binary Rate Multipliers" (revised March 1988) accessed at http://focus.ti.com/lit/ds/symlink/sn7497.pdf on Jan. 6, 2009, which is hereby incorporated by reference. Second, a reversed bit counter and comparator could be used. In this arrangement, one sets a number in a register and uses a counter. Compare the count to the number in the register. When this comparator outputs is low (that is, the counter is less than the register value) set the value high. Allow the counter to keep counting with wraparound. It is fairly easy to visualize that the times when the output is high are proportional to the value in the register. Then, take the counter connected to the comparator and wire it the wrong way around, where the most significant bit (MSB) is connected to the least significant bit (LSB) and so forth. That is, the next MSB is connected to the next LSB, until all of the bits in the register are connected. The output of the comparator still has the property that the pulse density is proportional to the number in the register, but now the pulses come out at a high-frequency. Third, use a first order Sigma-Delta modulator. Keep adding the desired pulse density to a running total, allowing the running total to overflow. When the overflow occurs, generate an output pulse. These are relatively complex alternatives to the binary weighted frequency array approach described below. Some of them produce a more accurate time-varying histogram, but exacting precision is not necessary, so long as the circuit discriminates accurately between histogram peaks related to single, double and triple length intervals between pulse edges.

Above, we indicated that the histogram in FIG. 2 depicts the edge frequency after at least 287 pulse edges. Given the various technologies described above for maintaining a time-varying histogram, this same histogram might represent a frequency distribution after a thousand or a million pulse edges, or it might represent a distribution of pulse edges at a particular time in long-term processing of a continuous input signal. One will see that a histogram that records the distribution of the last 287 pulse edges both discriminates between interval lengths in the presence of jitter and responds promptly to drift between the source and decoder clock.

Throughout our claims, we use the term "time-varying histogram" to mean a frequency record of inter-arrival times, measured in clock pulses from a reset on one pulse edge to detection of the next pulse edge that is updated as new pulses are received.

In normal biphase encoding, a single or double length interval is expected. When a biphase mark code is used, a word preamble includes a triple length interval. The relatively low frequency of preambles is apparent in FIG. 2 from the relatively low number of triple length intervals between pulse edges. The precise code and transmission standard for framing and synchronization will determine the number of bins in the histogram needed to discriminate among single length, double length, triple length or longer length intervals between adjacent pulse edges.

It is desirable for the ratio of the decoder clock frequency to the single length interval frequency of the signal to be large enough that the histogram produces at least one empty bin between peaks representing single, double and triple length intervals. A ratio of about 5 was adequate in this case to produce two empty bins between the bases of peaks. If there were more short-term jitter in the signal, a higher ratio of about 5.5, 6, 6.5, or 7 might be desirable. In varying circumstances, ranges of 5-7 or more than 5, 6 or 7 might be reasonable. With relatively small short-term jitters, a lower ratio such as 4 or 4.5 might be used.

The total number of bins in the histogram will depend on the frequency at the decoder clock and the maximum length between adjacent pulse edges in the input signal, with some margin to coverage jitter and drift in the source clock.

One environment in which the technology disclosed can be useful is decoding SPIDF signals generated by home audio components. SPIDF decoders are used in home receivers, PCs, amplifiers and the like. The technology disclosed is helpful for jitter rejection when receiving a signal from an inexpensive generating circuit. It also is helpful to follow drift in the frequency of a periodically varying source clock.

Another environment in which the technology disclosed as useful is point-to-point signaling among professional audio components. The Frandsen review, cited above, found that many professional components are unable to meet the higher standard of the professional AES/EBU specification. The technology disclosed is useful for building audio equipment.

More generally, the technology disclosed is useful for decoding signals that are encoded to permit clock recovery. This broad family of signals typically has a limited maximum interval length between adjacent pulse edges. For instance, a pulse edge or transition between high and low will be assured within a limited interval, such as 1, 2, 3 or 4 unit intervals of the data stream being encoded.

Figure 3:
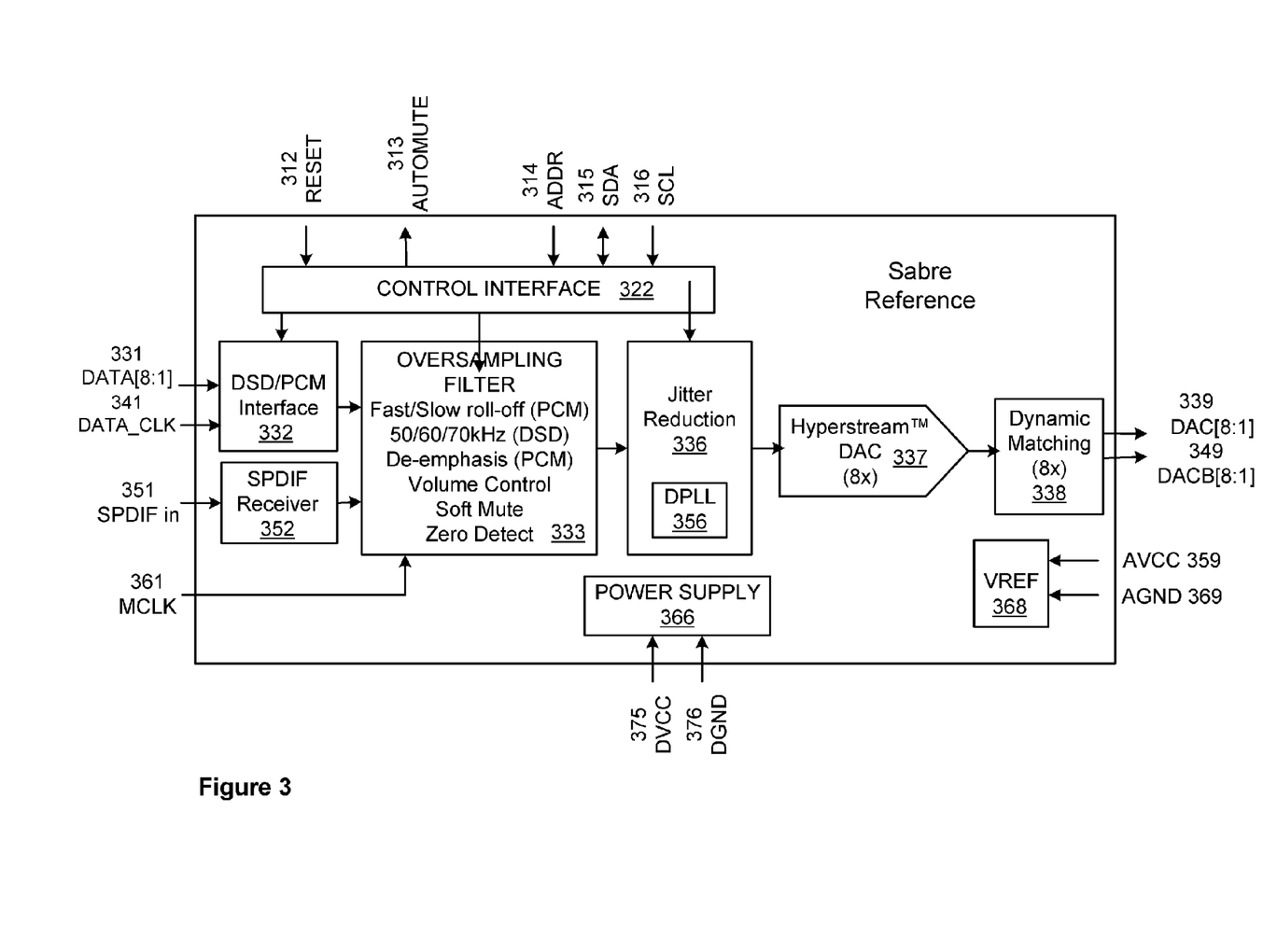
FIG. 3 is a functional block diagram of the Sabre reference DAC chip produced by ESS Technologies, part number ES9008.

A commercial product that uses the technology disclosed is a Sabre reference DAC chip produced by ESS Technologies, part number ES9008. FIG. 3 is a functional block diagram of this part. On the left are several inputs for data 331, data clock 341, a signal input 351, and a master clock 361. The control interface 322 receives control signals for reset 312, auto mute 313, addressing 314, SDA 315 and SCL 316. Power 375, 376 and a reference voltage 359, 369 are supplied to the part. The part outputs multiple channels of audio signals 339, 349. Functional blocks of the part include interfaces for pulse code modulated and SPDIF signals 332, 352, a controllable oversampling filter 333, a jitter reduction component 336, and a DPLL 356. A bank of Hyperstream™ digital-to-analog converters 337 process individual audio channels. A bank dynamic matching components 338 reproduce the analog data stream sound. A power supply 366 receives the power and a voltage reference 368 supplies the reference voltage to other components on the part. The technology disclosed is used in the interface for SPDIF signals 352.

The technology disclosed has proven useful in achieving very high signal-to-noise ratio and total harmonic distortion figures of merit. In the provisional application, which is hereby incorporated by reference, we provided some graphs showing the superiority of the Sabre reference chip that uses the technology disclosed. Immediately following its introduction, the Sabre chip's performance received widespread critical acclaim. The chip has been commercially successful.

Accompanying this document and incorporated by reference is a source code appendix for Verilog code that practices the technology disclosed. The code initially was written for a 27 MHz decoder clock. At 27 MHz, approximately 15 clocks elapsed between a reset and a pulse edge of a triple length interval in a BMC preamble.

The Verilog code creates a histogram of the number of edges that fall on a given number of elapsed clocks. Its logic accumulates values in histogram bins corresponding to on each clock pulse after a reset. A faster clock would require more histogram bins to cover the same real time interval. For 27 MHz, 20 bins were used.

This decoder can decode a biphase encoded signal without relying on a phase locked loop (PLL). In overview, the decoder takes an incoming signal and on every edge resets a counter. When the next edge comes along, some number of clocks have elapsed. The logic records how many clocks elapsed and builds a table of probabilities (a histogram) from these clock counts.

For example, suppose each table entry is a number from 0 to 1023, inclusive, conveniently represented by a 10 bit integer. Assume there are 16 table entries or bins. As an edge appears in the input, start a counter running and when the next edge appears, look at the counter. Say that the counter is at a count of five. Thus five clock pulses elapsed between edges. Increment bin 5 of the table by one, to record where the edge fell. Repeat this process over many incoming edges. At an edge rate of 3 MHz for instance, hundreds of edges will be encountered in just one millisecond.

Suppose the resulting table is as appears in FIG. 2. Some bins have a count of zero because no edges fell in these clock counts. The distribution is not random. Edges falling in bin numbers 4 and 5 are "1" encoded using BMC. The edges falling in bins 8, 9, or 10 encode code "0" data and the edges falling in bins 14 and 15 are the rule breaking preamble intervals.

As described above, the numbers in the histogram of FIG. 2 are not just counts, they are average values. Counts will quickly overflow a register or counter. The binary weighted frequency array implementation is further described below.

Given the table and FIG. 2, we can find the bit encoded in the input stream by representing the bins in the table with a single bit per bin: the bit indicates whether the value is zero or not. Zero entry flags for the data in FIG. 2 would be 1111001100001100.

When a new pulse edge is detected on an edge at the decoder clock, the zero entry flags may be updated. In time, as the clock counter runs, the output is the zero entry data, just the sequence of ones and zeros given above. A 2-bit counter can be clocked on the falling edge of the sequence. For the sequence of ones and zeros above, the counter values would be 00001111222222333. When the next edge is detected and the counter is at a value "1", the edge represents a single length interval that encodes a "1" in a biphase mark code. If the next edge is detected when this counter is "2", we have a double length interval that encodes a "0" in the biphase mark code. If the counter is "3", we have a preamble. A simple state machine can decode the modulated data stream. The module biphdec in the source code appendix is an example.

In the decoding that we describe, we did not assume anything about the clock rate compared to the input data. Our only requirement was that the table be long enough to catch the sync bit after a triple length interval and that there be enough bins to have at least one count of zero between peaks representing different interval links.

The time-varying frequencies of the table in FIG. 2 can be implemented using a binary weighted frequency array with very simple components: only one counter and one AND-OR-inverter gate. The table with 20 entries will work with a 30 MHz clock and input data sampled at a rate of 44.1 KHz or 48 KHz. Similarly, a histogram with 32 or 40 entries could be used with a 54 MHz clock and input data sampled at a rate of 96 KHz.

Figure 4:
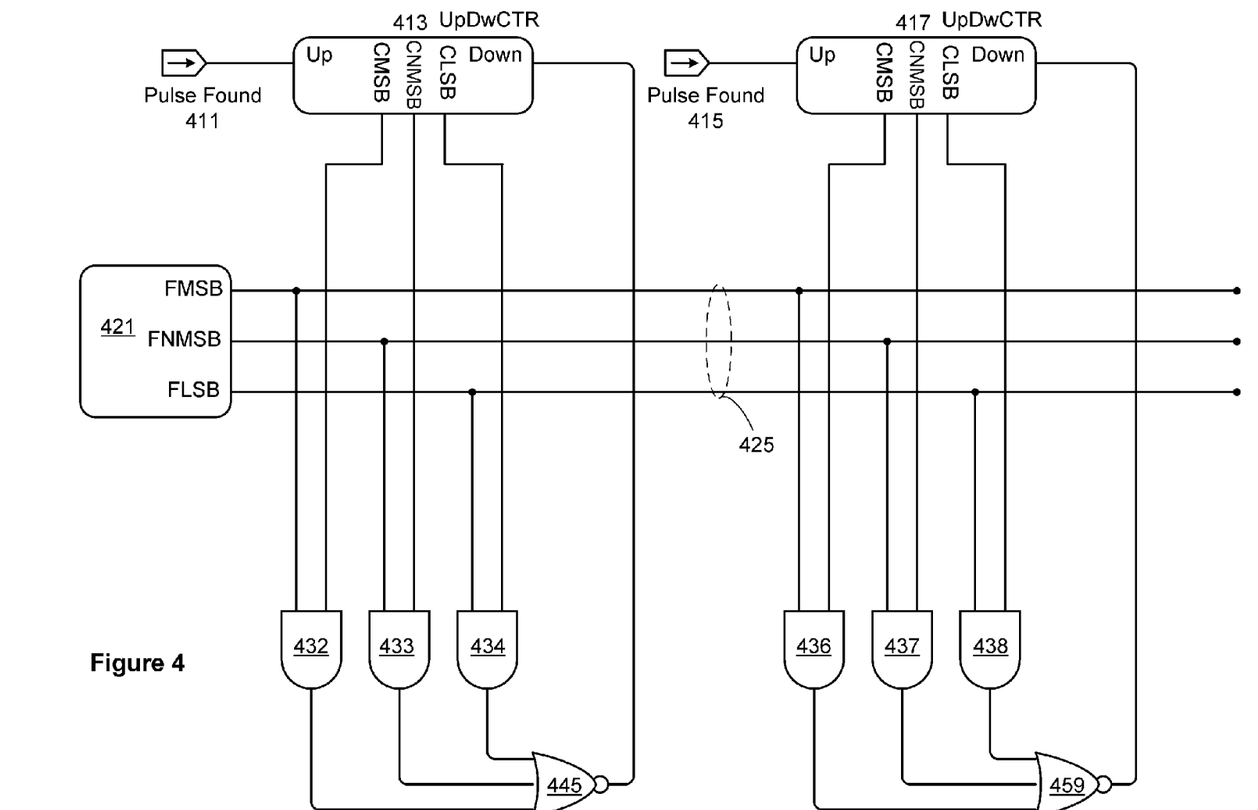
FIG. 4 illustrates two instances of counters with three decrement wires and three bits.

Next, we describe the binary weighted frequency array. This logic can be implemented on a chip with the very small footprint. Simple logic maintains the time-varying histogram. Basically, a set of decrement wires corresponding to the bits in the counters is crossed with the value wires connected to the bits in the counters, as depicted in FIG. 4. The decrement wires are orthogonal, meaning they are active one line at a time. The decrement wires are active in proportion to the magnitude of the bit in the counters to which they connect. The decrement wire connected to the bit wire for the most significant bit in the register is active about half the time. The decrement wire connected to the bit wire for the next most significant bit in the register is active only half as often. The decrement wire connected to the least significant bit in a 10-bit resister is active only once in 1024 clock cycles. Optionally, logic can be used to cover the one odd clock cycle not otherwise covered by this pattern of activating decrement lines.

FIG. 4 illustrates two instances of counters with three decrement wires and three bits. Each time the decrement wire for the most significant bit is activated, AND logic determines whether the value of the most significant bit in a counter is a "1". In a single array, outputs of the AND gates which connect respective decrement wires and bit wires are combined through a multi-way OR gate and inverter. The output of this simple AOI structure decrements the counter. The counter is an up-down counter that accepts both increment and decrement signals.

As the diagram indicates, the decrement lines can run across any number of counters for histogram bins. Each counter requires only one AOI structure connected to the same decrement lines as the other counters. In the code appendix, the module bwaf10 generates the resource binary weighted frequency array and the module pcaw10 (pulse count accumulator with 10) creates the pulse density output. It only takes a pair of lines in Verilog code to accomplish this.

The module pcas sets up 20 instances of the pulse count accumulators. As mentioned above, and histogram in FIG. 2 illustrates 16 of these 20 accumulators. Again, the interesting statistic is which accumulators have a count of zero, meaning that no pulse edges were detected at a certain number of clock cycles after a reset. These accumulators with the count of zero allow the circuit to discriminate among edges detected after a single, double or triple length interval. In the module the counter clkcnt is reset on detection of an edge by sampling it with "sam" and looking for transition. As we await the next edge, the clkcnt increments, each time, it probes the pcaw10 modules to see if the one at this clock edge is zero. As described above, on a falling edge from one to zero, bandclku pulses and increments a counter bandctr. Other details and cases are described in the source code appendix. The result of processing is that chang4 and the pulsew bus are used to signal when there has been an edge detected in the input signal and whether the edge followed a single, double or triple length interval.

The module biphdec makes a shift register clock and a shift register bit corresponding to the decoded biphase bit. Logic also handles the rule breaking synchronization pulse of a preamble. The module spdif_sync specifically looks for synchronization sequences in preambles. This module also handles the corner case of an unexpected quadruple length interval between pulse edges. In the biphase mark code, there should never be a quadruple length interval between pulse edges. However, this occasionally occurs, perhaps due to the limited bandwidth of SPDIF transmission. The code in the example treats every interval length longer than double as a triple.

In a design using a decoder clock running at 108 MHz, it was noticed that some of the data collected for interval lengths could be off by as much as seven pulse counts or 70 nanoseconds due to asymmetry in the rising and falling edge times; additional code was therefore included to handle asymmetrical rising and falling pulse edges.

Some Particular Embodiments

While this section focuses on biphase codes, we remind the reader that any of the examples or embodiments described below in the context of a biphase code can be extended to the more general family of balanced or grey codes with limited run lengths. The time-varying histogram can be applied to virtually any code having a limited run length or that is run length limited. Generally, a code that ensures that within n bits there will be a transition between a "0" and "1" bit, either 0/1 or 1/0, can be decoded using a histogram with $n*m+k$ bins, where m is the number of bins per bit and k is a few extra bits for safety. Examples are readily found of balanced codes with run lengths limited to 20, 10, 9, 8, 7, 6, 5 and 4 bits. Some or all of these limited run lengths are described in the patents that have been incorporated by reference.

Figure 5:
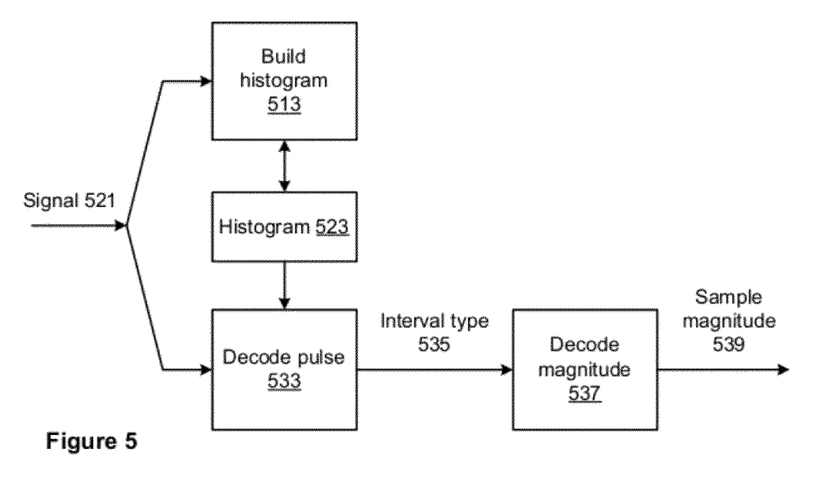
FIG. 5 is a flow chart of a method of enhanced jitter rejection and drift-following decoding a biphase encoded signal.

FIG. 5 is a flow chart of a method of enhanced jitter rejection and drift-following decoding a biphase encoded signal.

Jitter from various sources is rejected and drifts between the frequencies of the source and decoder clocks is handled. The method includes creating and maintaining 513 in real time, using an electronic device, a time-varying histogram 523 of transitions in the biphase encoded signal 521. Because the encoded information has a sample rate in the KHz range and an input stream carrying that data may be in the MHz range, only an electronic device can create and maintain a time-varying histogram in real time. The histogram 523 varies in real time responsive to signal jitter and clock drift. The method further includes decoding 533 the biphase encoded signal with the electronic device, using an absence of transitions falling in particular bins of the histogram to demark one or more boundaries between single and double length intervals among transitions, 535. A histogram (FIG. 2) has bins, as explained above. Testing has established that some bins in the histogram will be empty, even in the presence of significant jitter. We note that drift between the frequencies of the source and decoder clocks may change which bins are populated, but it should not impact the general profile of peaks that represent transitions for various lengths of intervals. A natural consequence of using the histogram to demark the boundaries is that the signal can be decoded without a need for synchronization within a frame between the source and decoder clocks. (This natural consequence of the method disclosed is not a separate feature of how the method is performed.)

A further aspect of this method embodiment applies directly to a biphase mark code compliant with a SPIDF or AES3 standard. A biphase mark code compliant with one of these standards has a triple length interval among transitions in a sub frame preamble. This triple length interval violates the general rule (FIG. 1) of a transition in each bit cell of the data stream. When the triple length interval is detected, it indicates a preamble. This aspect further includes using the absence of transitions in the particular bins of the time-varying histogram to demark the boundaries between double and triple length intervals among transitions, just as the basic method uses the histogram to demark boundaries between single and double length intervals among transitions.

This method and its further aspect can be applied to a variety of biphase encoded signals, some of which are illustrated in FIG. 1. In some applications of these codes, the method recovers the magnitude of an audio sample from a frame, sub frame or word in the signal. For claiming purposes, we use "frame" to refer to a frame, sub frame or word, unless the context clue indicates to the contrary. A pair of applications of this method to biphase mark codes are to recover 537 the magnitude 539 of audio samples from a signal compliant with a SPDIF interface standard or from a signal compliant with an AES3 interface standard. As explained above, the former is typically used for consumer and prosumer electronics. The latter is typically used for professional audio equipment. A second biphase encoded signal to which the method can be applied is a Manchester code. As explained above, Manchester codes include codes that signal a zero with a rising or falling transition and the so-called differential Manchester code.

Another aspect of the method uses (see FIG. 4) a series of registers 413, 417 to maintain the time-varying histogram. The registers are incremented when a transition 411, 415 falls into a timeslot represented by the register and decremented with a frequency proportional to the values stored in the register. A variety of methods of maintaining this time-varying register value are described above, including the binary weighted frequency array. This aspect further may include using a set of lines 425 corresponding to bits in the registers 413, 417 and decrementing a particular register (e.g., 413) when a line corresponding to a particular bit in the register is active (e.g., 421 FMSB) AND (432) that particular bit (e.g., 417 CMSB) has a one value in it. This aspect yet further may include activating the lines 425 orthogonally, only one line per clock pulse, activating particular lines at a rate proportional to their magnitude in the registers. Each line is activated twice as often as the line representing the next most significant bit in the register. For instance, FMSB (frequency activated, most significant bit) is activated twice as often as FNMSB. Similarly, FNMSB is activated twice as often as FLSB. The natural consequence of this order is that the line corresponding to the most significant bit is activated at least as often as all of the other lines put together. That is because the most significant bit has a greater magnitude than all of the other, less significant bits put together.

Figure 6:
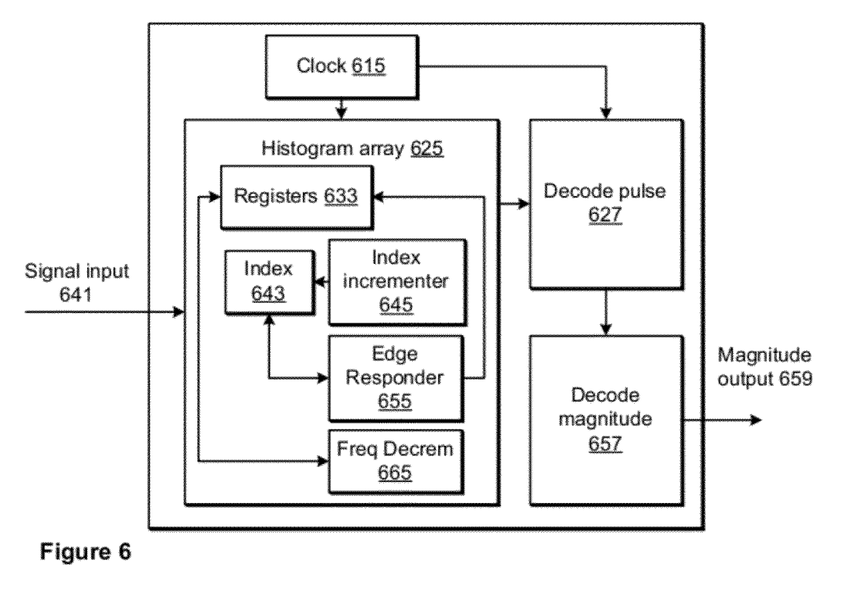
FIG. 6 is a high level block diagram of a decoder device that rejects jitter and follows drift while decoding a biphase encoded signal.

FIG. 6 is a high level block diagram of a decoder device that rejects jitter and follows drift while decoding a biphase encoded signal. This device is necessarily an electronic device, because it processes an electronic signal at a rate that no person could possibly match. The device includes an input 641 adapted to receive a biphase encoded signal having transitions separated by at least single and double length intervals. The device further includes a clock 615 running at least four times the frequency of a single length interval. Other ratios of frequency between the decoder clock and the frequency of a single length interval are given above, as well as ranges of ratios. The device further includes a histogram array 625 coupled to the input and the clock. This histogram array includes a series of registers 633 and several logic blocks 634, 655, 665. The series of registers represent a histogram of transitions in the biphase encoded signal. The first logic 645 increments a register index 643 responsive to the clock. The second logic 655, coupled to the series of registers and the register index, responds to a detection of the next transition by incrementing a value in a particular register 633 corresponding to the register index and resetting the register index. The third logic 665, coupled to the clock of the series of registers, decrements respective registers with the frequency proportional to values in the respective registers. The device further includes decoder logic 627, responsive to the clock and the next transition and coupled to the input and the binary weighted frequency array. The decoder logic uses the binary weighted frequency array to discriminate between the single and double length intervals among transitions.

One aspect of device embodiment refines the third logic. According to this aspect, the third logic further includes a set of lines corresponding to bits in the register and logic that decrements a particular register when a line corresponding to a bit in the particular register is active and the corresponding bit in the particular register has a "1" value. Building upon this aspect, the third logic may further include logic that activates the lines orthogonally, only one line per clock pulse, and activates particular lines at a rate proportional to a magnitude of the corresponding bit in the registers. Again, the natural consequence is that the line corresponding to the most significant bit is activated at least as often as all the other lines put together.

The device may practice any of the aspects of the methods and devices described above. For instance, it may include a decoder 657 that interprets the pulse edge types to recover the magnitude 659 of an input sample or other data from the input stream.

Another embodiment is a machine readable storage medium that stores program instructions adapted to carry out any of the method embodiments or aspects of method embodiments described above. A similar embodiment is a machine readable storage medium that stores program instructions, such as the instructions in the source code appendix, which, when compiled, can be used to produce a device adapted to carry out any of the method embodiments or aspects of method embodiments described above. For instance, the program instructions in the machine readable storage medium may program a programmable logic array, such as an FPGA. Or, the program instructions in the machine readable storage medium may be used to generate a cell logout in a custom integrated circuit. Both of the machine readable storage media embodiments may practice any of the aspects of the methods and devices described above. For instance, the program code may decode 537, 657 the pulse edge types to recover the magnitude 539, 659 of the input sample or other data from the input stream.

By machine readable storage medium, we mean to include rotating disk storage, such as magnetic and optical disks and non-rotating volatile or non-volatile storage, such as RAM, SRAM, DRAM, flash memory, charge trapping memory, BESONOS memory, ferric memory, phase-change memory, or ROM.

Any embodiment in a machine readable storage medium could also be carried by a signal, for instance when a program is being downloaded from machine readable storage medium on a server via the Internet to a user's computer for installation. Applicants respectfully submit that the signal embodies the technology disclosed, in an embodiment distinct from the machine readable storage medium on the computers that are connected by the signal.

In any of the following claims, embodiments that apply to a "limited run length encoded" signal apply to a "biphase encoded" signal, such as a signal compliant with a SPDIF interface standard or an AES3 interface standard.

I claim:

1. A method of enhanced jitter rejection and drift-following while decoding a limited run length encoded signal, the method including:
    creating and maintaining in real time using an electronic device a time-varying histogram of transitions in the limited run length encoded signal; and
    decoding the limited run length encoded signal with the electronic device, using an absence of transitions falling in particular bins of the histogram to demark one or more boundaries between single and double length intervals among transitions, whereby the decoding proceeds without a need for synchronization within a frame between source and decoder clocks.

2. The method of claim 1, wherein the limited run length encoded signal includes a triple length interval among transitions, in addition to the single and double length intervals, further including using the absence of transitions in the particular bins to demark the boundaries between the double and triple length intervals among transitions.

3. The method of claim 1, wherein the decoding recovers a magnitude of a sample from the frame.

4. The method of claim 1, wherein the limited run length encoded signal uses a biphase mark code compliant with a standard for a SPDIF interface and the decoding recovers magnitudes of audio samples.

5. The method of claim 1, wherein the limited run length encoded signal is compliant with an AES3 interface standard and the decoding recovers magnitudes of audio samples.

6. The method of claim 1, wherein the limited run length encoded signal uses a Manchester code and the decoding recovers data from the Manchester code signal.

7. The method of claim 1, wherein the time-varying histogram of transitions is maintained in a series of registers that are incremented when a transition falls into a time slot represented by the register and decremented with a frequency proportional to a value stored in the register.

8. The method of claim 7, wherein a set of lines correspond to bits in the registers, further including decrementing a particular register when a line corresponding to a bit in the particular register is active and the corresponding bit in the particular register has a "1" value.

9. The method of claim 8, further including activating the lines orthogonally, only one line per clock pulse, and activating particular lines at a rate proportional to their magnitude in the registers, whereby the line corresponding to the most significant bit is activated at least as often as all of the lines corresponding to the less significant bits, combined.

10. An decoder device that rejects jitter while decoding a limited run length encoded signal, the device including:
    an input that receives a limited run length encoded signal having transitions separated by at least single and double length intervals;
    a clock running at least four times the frequency of a single length interval;
    a histogram array coupled to the input and the clock that includes:
        a series of registers representing a histogram of transitions in the limited run length encoded signal;
        first logic that increments a register index responsive to the clock;
        second logic, coupled to the series of registers and the register index, that responds to detection of a next transition by,
            incrementing a value in a particular register corresponding to the register index and
            resetting the register index;
        third logic coupled to the clock and the series of registers that decrements respective registers with a frequency proportional to values in the respective registers; and
        decoder logic, responsive to the clock and the next transition and coupled the input and the binary weighted frequency array, that uses the binary weighted frequency array to discriminate between the single and double length intervals among the transitions.

11. The device of claim 10, wherein the third logic includes a set of lines correspond to bits in the registers and logic that decrements a particular register when a line corresponding to a bit in the particular register is active and the corresponding bit in the particular register has a "1" value.

12. The device of claim 11, wherein the third logic further includes logic that activates the lines orthogonally, only one line per clock pulse, and activates particular lines at a rate proportional to a magnitude of the corresponding bit in the registers, so that the line corresponding to the most significant bit is activated at least as often as all of the lines corresponding to the less significant bits, combined.

13. A non-transitory machine readable storage media recording computer instructions adapted to enhanced jitter rejection and drift-following while decoding a limited run length encoded signal, the computer instructions including instructions to:
    create and maintain in real time a time-varying histogram of transitions in the limited run length encoded signal; and
    decode the limited run length encoded signal, using an absence of transitions falling in particular bins of the histogram to demark one or more boundaries between single and double length intervals among transitions, whereby the decoding proceeds without a need for synchronization within a frame between source and decoder clocks.

14. The non-transitory machine readable storage media of claim 13, wherein the limited run length encoded signal includes a triple length interval among transitions, in addition to the single and double length intervals, further including instructions to use the absence of transitions in the particular bins to demark the boundaries between the double and triple length intervals among transitions.

15. A non-transitory computer readable storage media, recording computer instructions adapted to configure a programmable logic array device, including at least an FPGA, or to generate a cell design in a custom integrated circuit device, the resulting device providing enhanced jitter rejection and drift-following while decoding a limited run length encoded signal, the computer instructions including instructions to:

create and maintain in real time a time-varying histogram of transitions in the limited run length encoded signal; and decode the limited run length encoded signal, using an absence of transitions falling in particular bins of the histogram to demark one or more boundaries between single and double length intervals among transitions, whereby the decoding proceeds without a need for synchronization within a frame between source and decoder clocks.

16. The non-transitory computer readable storage media of claim 15, wherein the limited run length encoded signal includes a triple length interval among transitions, in addition to the single and double length intervals, further including instructions to use the absence of transitions in the particular bins to demark the boundaries between the double and triple length intervals among transitions.

\* \* \* \* \*